United States Patent [19]

Lee et al.

[11] Patent Number: 5,715,206

[45] Date of Patent: Feb. 3, 1998

[54] DYNAMIC RANDOM ACCESS MEMORY HAVING SEQUENTIAL WORD LINE REFRESH

[75] Inventors: Jae-Hyeong Lee; Hyung-Kyu Lim, both of Seoul, Rep. of Korea

[73] Assignee: Samsung Electronics Co., Ltd., Suwon, Rep. of Korea

[21] Appl. No.: 701,672

[22] Filed: Aug. 22, 1996

[30] Foreign Application Priority Data

Aug. 24, 1995 [KR] Rep. of Korea ............ 95-26270

[51] Int. Cl.$^6$ .................. G11C 7/00; G11C 8/00
[52] U.S. Cl. ............ 365/222; 365/230.06; 365/230.08; 365/236
[58] Field of Search ............ 365/222, 230.06, 365/230.08, 236

[56] References Cited

U.S. PATENT DOCUMENTS

| | | | |
|---|---|---|---|
| 4,754,425 | 6/1988 | Bhadriraju | 365/222 |
| 4,807,197 | 2/1989 | Watanabe | 365/222 |
| 4,849,936 | 7/1989 | Mizutani | 365/222 |
| 4,943,960 | 7/1990 | Komatsu et al. | 365/222 |
| 4,989,183 | 1/1991 | Komanoya et al. | 365/222 |
| 5,262,998 | 11/1993 | Mnich et al. | 365/222 |
| 5,299,168 | 3/1994 | Kang | 365/222 |
| 5,373,475 | 12/1994 | Nagase | 365/222 |
| 5,457,659 | 10/1995 | Schaefer | 365/222 |
| 5,477,491 | 12/1995 | Shirai | 365/222 |
| 5,502,677 | 3/1996 | Takahashi | 365/222 |
| 5,555,527 | 9/1996 | Kotani et al. | 365/222 |
| 5,566,119 | 10/1996 | Matano | 365/222 |
| 5,583,818 | 12/1996 | You et al. | 365/222 |

OTHER PUBLICATIONS

"DRAM Refresh Modes", Semiconductor Technical Data, Publication No. AN/987, Motorola, Inc., 1994.

"512K ×8 CMOS Dynamic RAM Page Mode", Motorola Semiconductor Technical Data, Publiction No. MCM54800A/D, Motorola, Inc., 1995.

Primary Examiner—David C. Nelms
Assistant Examiner—Trong Quang Phan
Attorney, Agent, or Firm—Myers Bigel Sibley & Sajovec

[57] ABSTRACT

A DRAM includes a refresh controller including a clock control section for producing a refresh mode signal in response to an external control clock signal, a refresh logic section for producing an enable signal in response to the refresh mode signal, a refresh counter for sequentially producing a first plurality of row address signals during an active period of a row address strobe signal in response to the enable signal, a row address buffer for producing a second plurality of row address signals in response to the row address signals, and a row decoder including a plurality of word line drivers which sequentially decode the second plurality of row address signals provided from the row address buffer and sequentially enables word lines corresponding to the decoded row address signals.

3 Claims, 3 Drawing Sheets

DYNAMIC RANDOM ACCESS MEMORY HAVING SEQUENTIAL WORD LINE REFRESH

FIELD OF THE INVENTION

The present invention relates to integrated circuits, in particular, to memory devices.

BACKGROUND OF THE INVENTION

In a typical dynamic random access memory (DRAM), data retention generally requires refresh of the memory cells in the DRAM. A refresh cycle generally represents the time needed to refresh all the cells in a chip once, and is typically determined by the number of row addresses. Therefore, as the level of DRAM integration has increased, the length of the refresh cycle has also increased. To reduce the frequency of refreshing, it is generally desirable to increase the data retention time of the cells in the DRAM. However, increased data retention is generally more difficult to achieve in highly integrated DRAMs because of the decreased size of the cell capacitors and the drop of the power supply voltage caused by increased operating current.

A method of reducing the refresh cycle has been introduced wherein the number of word lines which are selected in one refresh cycle is doubled when the refresh mode is selected. According to this technique, however, the refresh operating current may be undesirably increased, causing noise and deterioration of chip performance.

FIG. 1 is a block diagram of a conventional DRAM semiconductor memory device. Referring to FIG. 1, chip control clocks such as a row address strobe signal RAS, a column address strobe signal CAS, and a write control signal W are applied to a clock control section 10 in a chip. The clock control section 10 produces a refresh mode signal by combining the chip control clocks. A refresh control logic section 12 produces a refresh enable signal in response to the refresh mode signal. A refresh counter section 14 is enabled in response to the refresh enable signal, outputting counted values. Row address outputs from a row address buffer 16 are determined in accordance with the outputs of the refresh counter section 14. Typically, the row address outputs are held in one state during each cycle of the row address strobe signal RAS. Word lines to be enabled are determined by the selected row decoders 18, and the cells coupled to the word lines of a cell array 20 are selected.

FIG. 2 is a timing diagram explaining the word line operation in a refresh mode according to the conventional semiconductor memory device of FIG. 1. Referring to FIG. 2, a plurality of word lines WL0 to WLn, which are synchronized with and selected by the row address strobe signal RAS, are simultaneously enabled. Practically, the period when the refresh operation is performed corresponds to a short period from the front edge of each word line driving signal, while the greater remaining period of the word line driving signal corresponds to a waiting time. Accordingly, though the refresh operating period is very short in comparison to the active period of the row address strobe signal RAS, the word line driving signal synchronized with the row address strobe signal RAS has an active period similar to that of the row address strobe signal RAS. Consequently, since a plurality of word lines are simultaneously driven, the operating current and the peak current, are generally increased, and this causes the noise occurrence, power loss, etc., resulting in the deterioration of the chip performance.

SUMMARY OF THE INVENTION

In light of the foregoing, it is an object of the present invention to provide a dynamic random access memory (DRAM) with a refresh controller which can reduce the refresh cycle without deterioration of the chip performance.

This and other objects, features and advantages are provided according to the present invention, by a dynamic random access memory (DRAM) having clock control means for producing a refresh mode signal in response to an external control clock signal, refresh logic means for producing an enable signal in response to said refresh mode signal provided from said clock control means, refresh counter means for sequentially producing a first plurality of row address signals during an active period of a row address strobe signal in response to said enable signal provided from said refresh logic means, a row address buffer for producing a second plurality of row address signals in response to said first plurality of row address signals provided from said refresh counter means, and a row decoder including a plurality of word line drivers for sequentially decoding said second plurality of row address signals provided from said row address buffer and for sequentially enabling word lines corresponding to the decoded row address signals.

BRIEF DESCRIPTION OF THE DRAWINGS

The above object, other features and advantages of the present invention will become more apparent by describing the preferred embodiment thereof with reference to the accompanying drawings, in which.

DETAILED DESCRIPTION OF PREFERRED EMBODIMENTS

Figure 1:
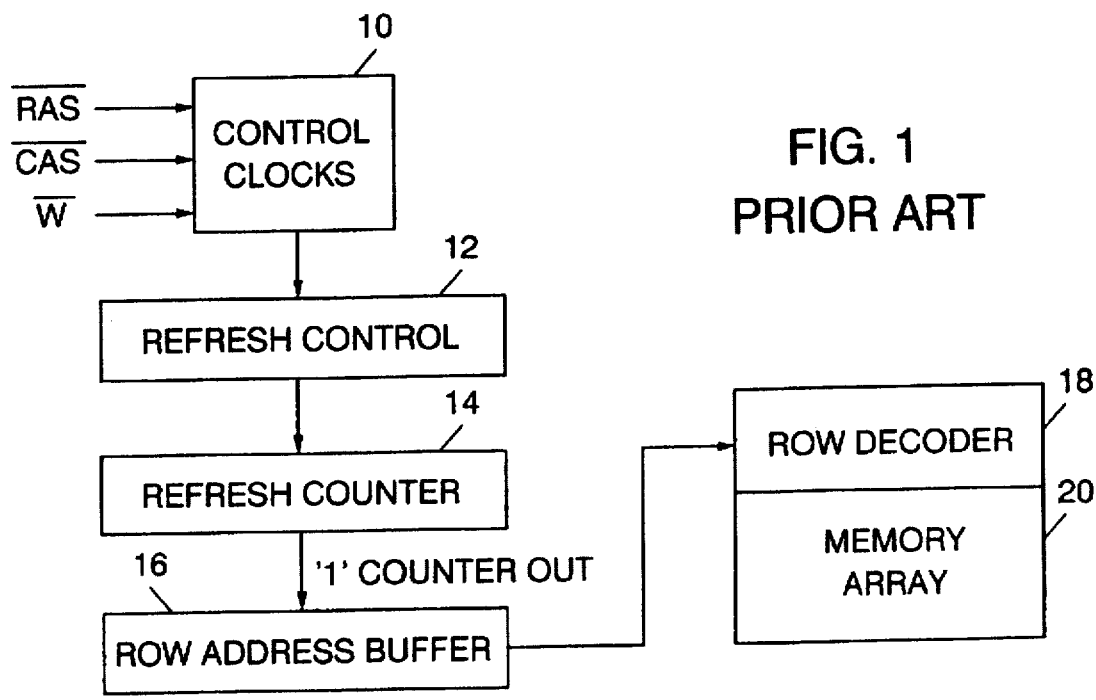
FIG. 1 is a block diagram of a refresh controller for a DRAM according to the prior art.
Figure 2:
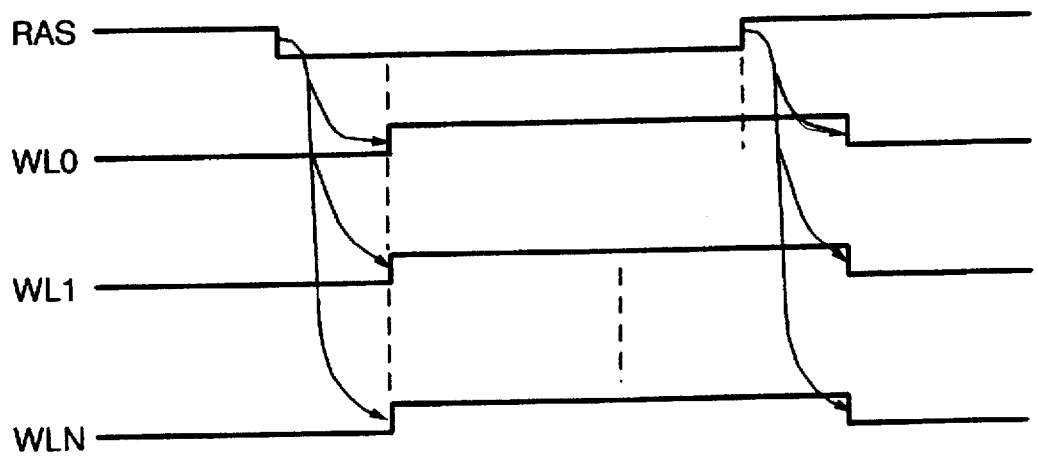
FIG. 2 is a timing diagram illustrating word line operation in a refresh mode in a DRAM according to the prior art.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
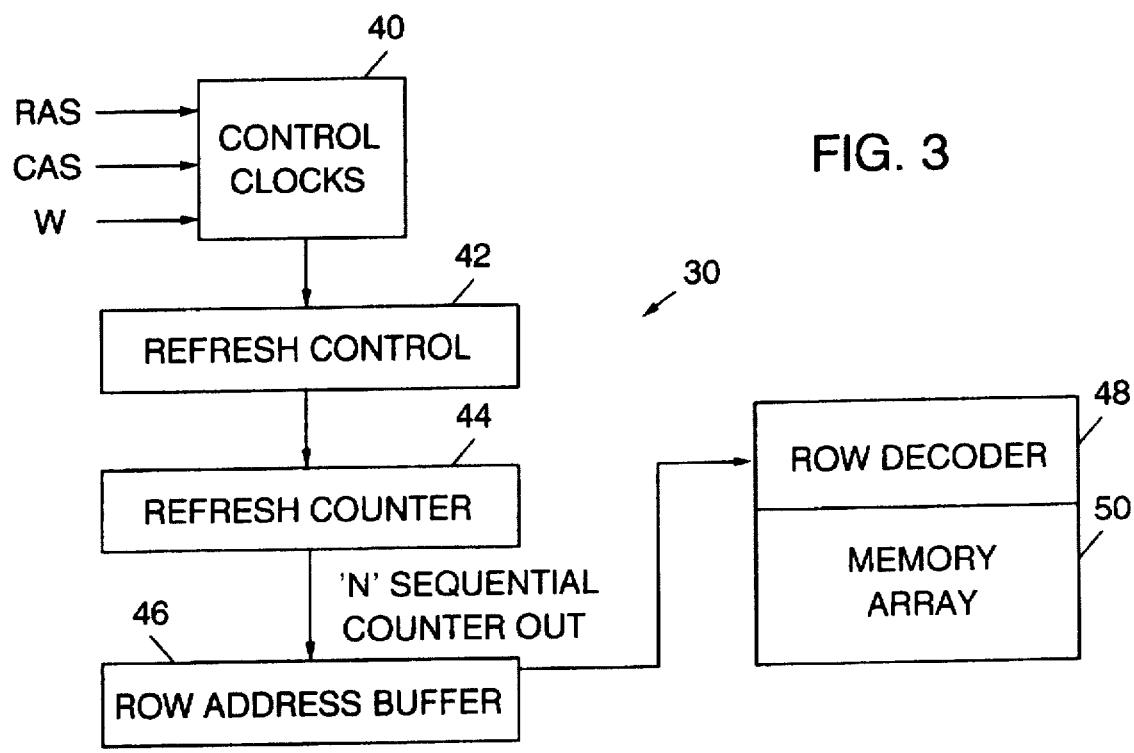
FIG. 3 is a block diagram of a refresh controller for a DRAM according to the present invention.

FIG. 3 illustrates a refresh controller 30 in a DRAM according to the present invention. A clock control section 40 produces a refresh mode signal by combining chip control clocks inputted thereto such as a row address strobe signal RAS, a column address strobe signal CAS, and a write control signal W, in a refresh mode. A refresh control logic section 42 produces an enable signal in response to the refresh mode signal provided from the clock control section 40, and a refresh counter section 44 is enabled by the enable signal. Row address outputs from a row address buffer 46 are determined in accordance with the outputs of the refresh counter section 44. At this time, the row addresses outputted from the refresh counter section 44 are sequentially increased for one cycle of the row address strobe signal RAS, and the row address buffer 46 transfers the outputs of the refresh counter section 42 to a row decoder 48, so that the word lines to be selected are changed.

Figure 4:
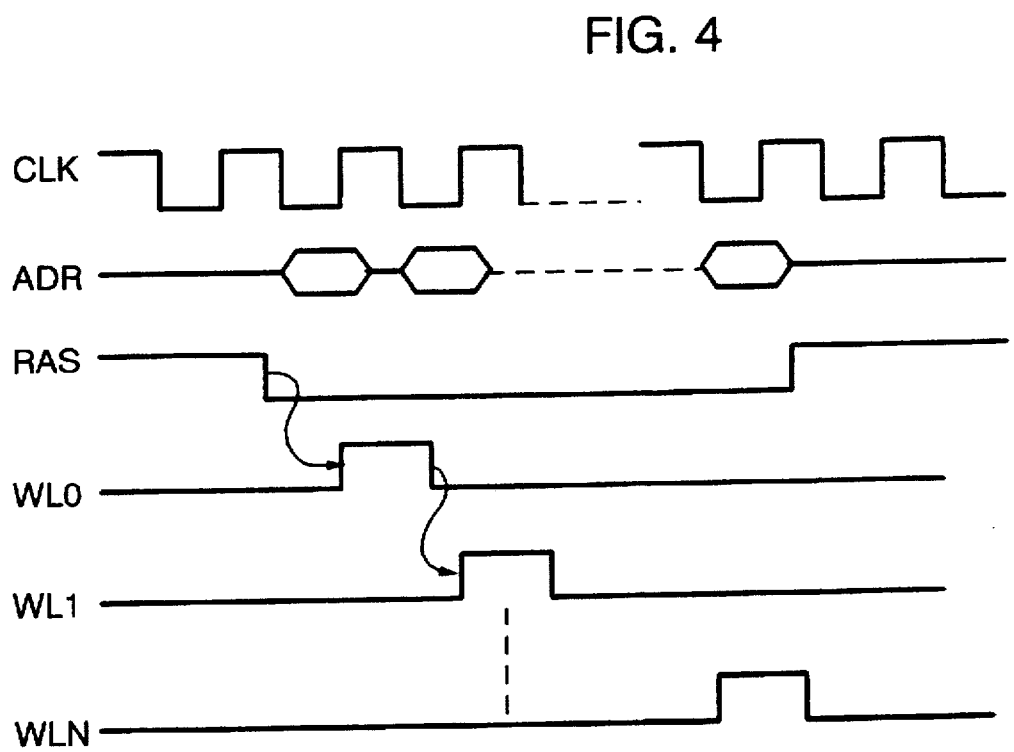
FIG. 4 is a timing diagram illustration word line operation in a refresh mode according to the present invention.

Accordingly, the number of word lines which are enabled during one cycle of the row address strobe signal is increased, causing the refresh cycle to be decreased. Referring to FIG. 4, a plurality of clock signals CLK are sequentially produced during a cycle of the row address strobe signal RAS by the refresh logic means 42. In turn, the multiple clocks cause a plurality of row address signals ADR to be sequentially produced during the cycle of the row address strobe signal RAS. As shown in FIG. 4, since the enable timing of the word line is sequentially generated, the word lines to be selected are also sequentially increased for one cycle of the row address strobe signal RAS, thus helping limit peak current and maintain chip performance.

Figure 5:
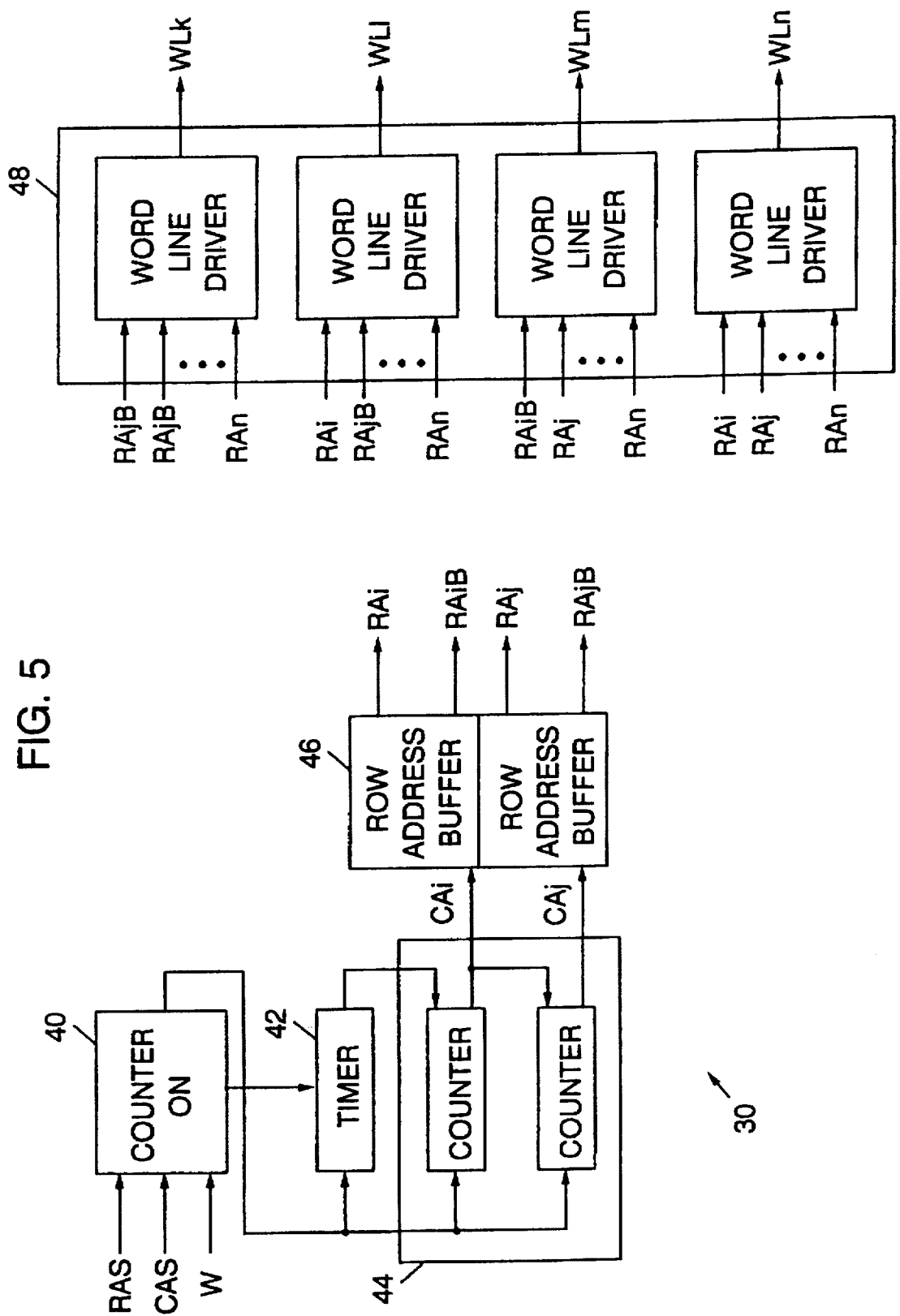
FIG. 5 is a schematic circuit diagram of a preferred embodiment of a refresh controller for a DRAM according to the present invention.

In the embodiment illustrated in FIG. 5, four word lines are sequentially enabled. In a refresh mode, the row address strobe signal RAS, column address strobe signal CAS, and write control signal W are applied to the clock control section 40, and a timer in the refresh logic section 42 and counters in the refresh counter section 44 are enabled. The state of the row addresses RAi, RAiB, RAj, and RAjB outputted from the row address buffer 46 is determined in accordance with the state of the outputs CAi and CAj of the counters in the refresh counter section 44.

Specifically, as the state of the counter outputs CAi and CAj is repeatedly changed, for example, 00→01→10→11, the state of the row addresses RAi, RAiB, RAj, and RAjB is also repeatedly changed. Accordingly, four word line drivers in the row decoder 48 are sequentially enabled by combination of the row addresses RAi, RAiB, RAj, and RAjB, resulting in that the word lines WLk, WLl, WLm, and WLn are also sequentially enabled. The timer produces a pulse signal having a predetermined period for determining the number of word lines to be enabled for one cycle of the row address strobe signal RAS. The output of the timer is coupled to the input of the counter.

From the foregoing, it will be apparent that the present invention provides the advantages in that it can reduce the refresh cycle without deterioration of the DRAM performance by sequentially activating a plurality of word lines in one refresh cycle.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A dynamic random access memory (DRAM), comprising:

clock control means for producing a refresh mode signal in response to an external control clock signal, said external clock control signal including a row address strobe signal having an active period;

refresh logic means, responsive to said clock control means, for producing an enable signal in response to said refresh mode signal provided from said clock control means;

refresh counter means, responsive to said refresh logic means, for sequentially producing a first plurality of row address signals during one active period of said row address strobe signal in response to said enable signal provided from said refresh logic means;

a row address buffer, responsive to said refresh counter means, for producing a second plurality of row address signals during said one active period of said row address strobe signal in response to said first plurality of row address signals provided from said refresh counter means; and a row decoder, responsive to said row address buffer including a plurality of word line drivers which sequentially decode said second plurality of row address signals provided from said row address buffer to produce a decoded second plurality of row address signals and to sequentially enable a plurality of word lines corresponding to the decoded second plurality of row address signals, during said one active period of said row address strobe signal.

2. A DRAM according to claim 1, wherein said refresh logic means comprises a timer which is enabled in response to said refresh mode signal and produces a plurality of clock signals during said one active period of said row address strobe signal.

3. A DRAM according to claim 1, wherein said refresh counter means comprises counters which are enabled in response to said refresh mode signal and receive and count said enable signal provided from said refresh logic means.

* * * * *